US007979636B2

(12) United States Patent
Ito (10) Patent No.: US 7,979,636 B2
(45) Date of Patent: Jul. 12, 2011

(54) METHOD OF CONTROLLING SEMICONDUCTOR MEMORY CARD SYSTEM

(75) Inventor: Takafumi Ito, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 640 days.

(21) Appl. No.: 11/837,872

(22) Filed: Aug. 13, 2007

(65) Prior Publication Data

US 2008/0046649 A1    Feb. 21, 2008

(30) Foreign Application Priority Data

Aug. 17, 2006   (JP) .................................. 2006-222638

(51) Int. Cl.
*G06F 12/00* (2006.01)
*G06F 13/00* (2006.01)
*G06F 13/28* (2006.01)

(52) U.S. Cl. .......................... 711/115; 711/104; 711/154
(58) Field of Classification Search .................. 711/115, 711/104, 154
See application file for complete search history.

(56) References Cited

U.S. PATENT DOCUMENTS

| 2003/0002366 A1* | 1/2003 | Mizoguchi et al. ........... 365/201 |
| 2003/0135793 A1* | 7/2003 | Craig et al. ...................... 714/42 |
| 2007/0180186 A1* | 8/2007 | Cornwell et al. ............. 711/103 |

FOREIGN PATENT DOCUMENTS

| JP | 7-65592 | 3/1995 |
| JP | 2003-85054 | 3/2003 |

* cited by examiner

*Primary Examiner* — Kevin L Ellis
*Assistant Examiner* — Ryan Bertram
(74) *Attorney, Agent, or Firm* — Oblon, Spivak, McClelland, Maier & Neustadt, L.L.P.

(57) ABSTRACT

A method of controlling a semiconductor memory card system including a host device incorporating a semiconductor memory card and communicating information with a user of the host device to warn the imminent end of the life of the memory card in the system is provided. According to one aspect, there is provided a method of controlling a semiconductor memory card, the method comprising creating end-of-life index data of the semiconductor memory card, reading the end-of-life index data in response to a command from a host device to the semiconductor memory card, creating an end-of-life warning status of the semiconductor memory card from the end-of-life index data based on a life control limit value, and sending a response containing the end-of-life warning status to the host device as a response to the command through the same communication line as that for the command.

20 Claims, 7 Drawing Sheets

FIG. 1

| Pin No. | Signal |
|---|---|
| Pin 1 | Card detection / data 3 (DAT3) |
| Pin 2 | Command (CMD) |
| Pin 3 | Vss |
| Pin 4 | Vdd |
| Pin 5 | Clock (CLK) |
| Pin 6 | Vss |
| Pin 7 | Data 0 (DAT0) |
| Pin 8 | Data 1 (DAT1) |
| Pin 9 | Data 2 (DAT2) |

METHOD OF CONTROLLING SEMICONDUCTOR MEMORY CARD SYSTEM

CROSS-REFERENCE TO RELATED APPLICATIONS

This application is based upon and claims the benefit of priority from prior Japanese Patent Application No. 2006-222638, filed Aug. 17, 2006, the entire contents of which are incorporated herein by reference.

BACKGROUND OF THE INVENTION

1. Field of the Invention

The present invention relates to a method of controlling a semiconductor memory card system and, more particularly, to a control method of communicating warning information in a semiconductor memory card system.

2. Description of the Related Art

Semiconductor memory cards such as SD™ memory cards are widely used in electronic devices such as digital cameras, portable music players, and personal computers as media to store, e.g., image data, music data, and information data. A semiconductor memory card uses a nonvolatile semiconductor memory such as a flash memory. A typical example is a NAND flash memory.

A flash memory such as a NAND memory erases/writes data in blocks with a predetermined size. If the number of times of data erase/write of one block is greater than a predetermined reference value, the reliability of data write in that block may be lowered, or the block may become unusable in some instances.

A semiconductor memory card such as an SD memory card has several spare blocks, in general. This prevents the card itself from becoming unusable even when some unusable blocks (acquired defective blocks) occur. Additionally, a semiconductor memory card uniformly distributes erase/write blocks throughout the semiconductor memory device in the card, instead of concentrating the erase/write blocks to specific blocks.

However, if a user uses a single card for a long time, data rewrite in the card may be done an enormous number of times, and the reliability of stored data may lower. If the number of defective blocks increases, the card itself may become unusable.

A conventional nonvolatile semiconductor memory has a function of causing the semiconductor memory device itself to count the number of times of rewrite and, if it is greater than a maximum rewritable count, outputting a warning signal, as disclosed in, e.g., Jpn. Pat. Appln. KOKAI Publication No. 7-65592. A semiconductor memory card disclosed in, e.g., Japanese Patent Laid-Open No. 2003-85054 has spare blocks (redundant blocks). This semiconductor memory card has a function of turning on a built-in light emitting diode (LED) to warn the user if the number of remaining spare blocks becomes less than a predetermined value after data rewrite.

The semiconductor memory device or semiconductor memory card itself has the above-described functions. However, either the semiconductor memory device or the semiconductor memory card has no means for communicating the warning to a host device such as a digital camera incorporating them.

BRIEF SUMMARY OF THE INVENTION

According to one aspect of the present invention, there is provided a method of controlling a semiconductor memory card, the method comprising: creating end-of-life index data of the semiconductor memory card; reading the end-of-life index data in response to a command from a host device to the semiconductor memory card; creating an end-of-life warning status of the semiconductor memory card from the end-of-life index data on the basis of a life control limit value; and sending a response containing the end-of-life warning status to the host device as a response to the command through the same communication line as that for the command.

According to another aspect of the present invention, there is provided a method of controlling a host device incorporating a semiconductor memory card, the method comprising: causing the host device to issue a command to the semiconductor memory card; causing the host device to receive, from the semiconductor memory card, a response responding to the issued command and containing an end-of-life warning status of the semiconductor memory card; causing the host device to analyze the end-of-life warning status; and causing the host device to warn a user of the host device of imminent end of life of the semiconductor memory card if the end-of-life warning status is set to an alarm.

DETAILED DESCRIPTION OF THE INVENTION

The present invention provides a method of controlling a semiconductor memory card system, which includes a host device incorporating a semiconductor memory card, and which communicates information with a user of the host device to warn the imminent end of the life of the semiconductor memory card in the system.

According to embodiments of the present invention, a method of controlling a semiconductor memory card system is provided to warn a user of a host device of the imminent end of the life of the semiconductor memory card incorporated in the host device. In the method, the semiconductor memory card communicates life information with the host device by putting the information into a response from the semiconductor memory card to the host device responding to a command from the host device. The present invention enables to warn the user of the host device of the imminent end of the life of the semiconductor memory card before it becomes unusable.

The embodiments of the present invention will be described with reference to the accompanying drawings. The accompanying drawings, which are incorporated in and constitute a part of the specification, illustrate embodiments of the invention, and together with the general description given above and the detailed description of the embodiments given below, serve to explain principles of the invention. Throughout the drawings, corresponding portions are denoted by corresponding reference numerals. The embodiments are only examples, and various changes and modifications can be made without departing from the scope and spirit.

First Embodiment

A first embodiment of the present invention provides a method of controlling a semiconductor memory card. The semiconductor memory card is incorporated in a host device, such as a digital camera or a personal computer. In this method, the semiconductor memory card communicates with the host device of an end-of-life warning status of the memory card by putting it into an initialization response responding to an initialization command from the host device to the semiconductor memory card.

According to this embodiment, the end-of-life warning status of the semiconductor memory card enables to warn a user of the host device of the imminent end of the life of the semiconductor memory card before it becomes unusable. The user of the host device can replace the semiconductor memory card on the basis of this warning. This prevents the semiconductor memory card from becoming unusable and losing data stored therein.

The semiconductor memory card is, e.g., an SD™ memory card incorporating a NAND flash memory. The imminent end of the life of the SD memory card can be detected by a plurality of methods. For example, the remaining spare block count of the NAND flash memory or the number of times of erase/write in each block of the NAND flash memory is usable to know the imminent end of the life of the SD memory card. This embodiment exemplifies the remaining spare block count as an index to detect the end of life of the semiconductor memory card.

Figure 1:
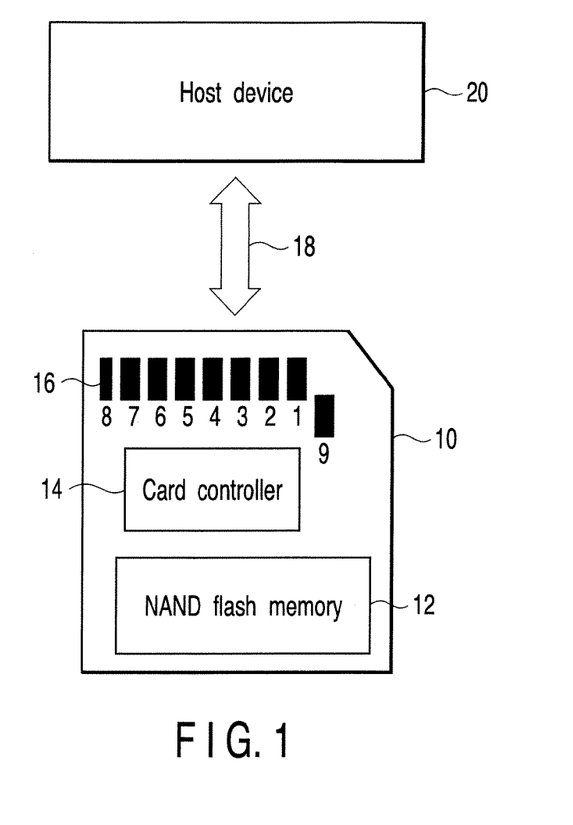
FIG. 1 is a schematic view showing an example of a system using a semiconductor memory card to explain the present invention.

FIG. 1 is a schematic view showing an example of a system using a semiconductor memory card to explain the present invention. A semiconductor memory card 10 such as an SD memory card exchanges information with a host device 20 such as a digital camera or a personal computer via a card interface 18. The SD memory card 10 comprises a NAND flash memory 12 to store data, a card controller 14 to control operation of the NAND flash memory 12, and a plurality of signal pins 16 connected to the card interface 18.

Figure 2:
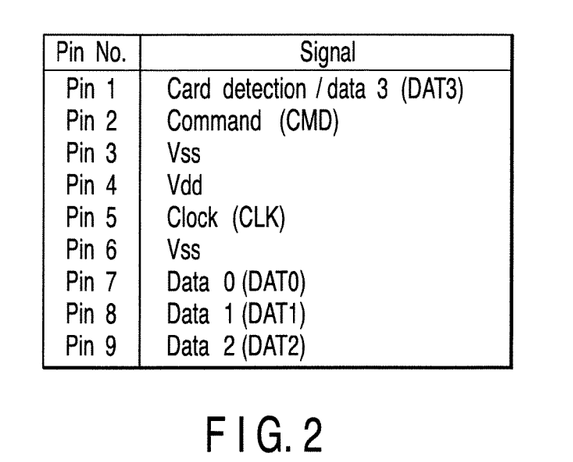
FIG. 2 shows an example of pin allocation in a semiconductor memory card to explain the present invention.

The signal pins 16 of the SD memory card 10 include nine pins which are numbered 1 to 9 and assigned to, e.g., communications of signals as shown in FIG. 2. A command, e.g., an initialization command, issued by the host device 20 is communicated to the SD memory card 10 via pin 2 connected to a command communication line. Data communication between the host device 20 and the SD memory card 10 is executed through pins 7 to 9 and pin 1 connected to data communication lines. In other words, command communication and data communication between the host device 20 and the SD memory card 10 can be executed through different pins, i.e., different communication lines.

Figure 3:
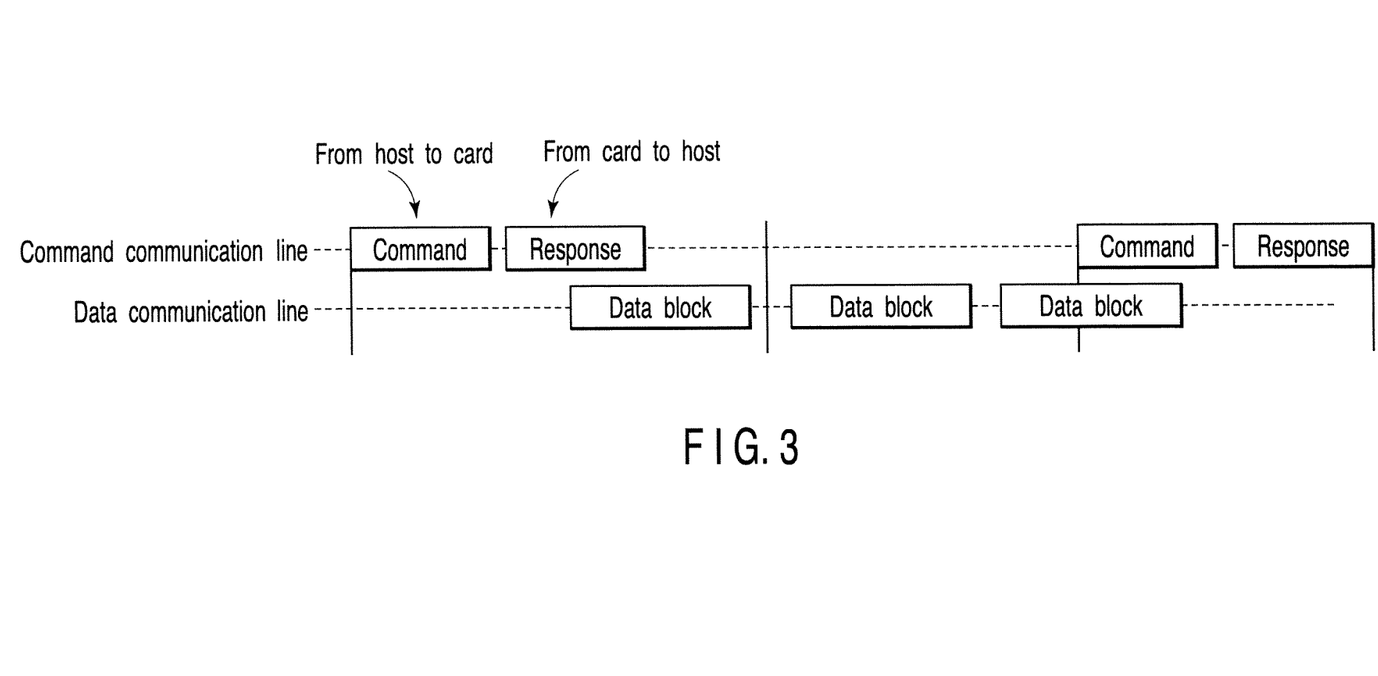
FIG. 3 is a view for explaining a command communication line between a host device and a semiconductor memory card.

FIG. 3 is a view for explaining the command communication line between the host device 20 and the semiconductor memory card 10. As shown in FIG. 3, a command from the host device 20 and a response from the semiconductor memory card 10 responding to the command are communicated through the same command communication line. The present invention provides a method of controlling a semiconductor memory card system related to a command from the host device 20 and a response from the semiconductor memory card 10 responding to the command and communicated through the command communication line.

A method of setting an end-of-life index data of the SD memory card 10 according to this embodiment will be described next. In the NAND flash memory 12 of the SD memory card 10, erase/write is executed in every block including a plurality of pages. Data write is done by writing data in an erased block, instead of overwriting a block storing data to be rewritten. Hence, the NAND flash memory 12 has NAND blocks more than the nominal memory capacity. The number of NAND blocks beyond the nominal memory capacity is called as a spare block count. Utilization of the spare blocks changes depending on the design of the semiconductor memory card. In an example, the NAND flash memory 12 uniformly uses all NAND blocks including the spare blocks to ensure a long life span in the entire semiconductor memory card 10. In another example, blocks are fixed without using the spare blocks until an acquired defective block (to be simply referred to as defective block hereinafter) occurred.

In write in the SD memory card 10, for example, if write in a write target NAND block does not finish within a predetermined time period, the NAND block is determined to be defective. Upon detecting the defective NAND block, information representing that the block is defective is written in the system management area of the NAND flash memory 12, which stores the attribute information of each block.

The number of defective blocks is counted on the basis of information in the system management area. A usable spare block count (to be referred to as a remaining spare block count hereinafter) R is obtained as the end-of-life index data of the SD memory card 10. An end-of-life warning status is generated by comparing the remaining spare block count R with a spare block control limit value L to determine an end of life of the memory card. If the remaining spare block count R is less than the spare block control limit value L (R<L), the end-of-life warning status is set to an alarm to notify the user of the imminent end of the life of the SD memory card 10. The spare block control limit value L for end-of-life determination is determined on the basis of the characteristics and applications of the semiconductor memory card.

Figure 4:
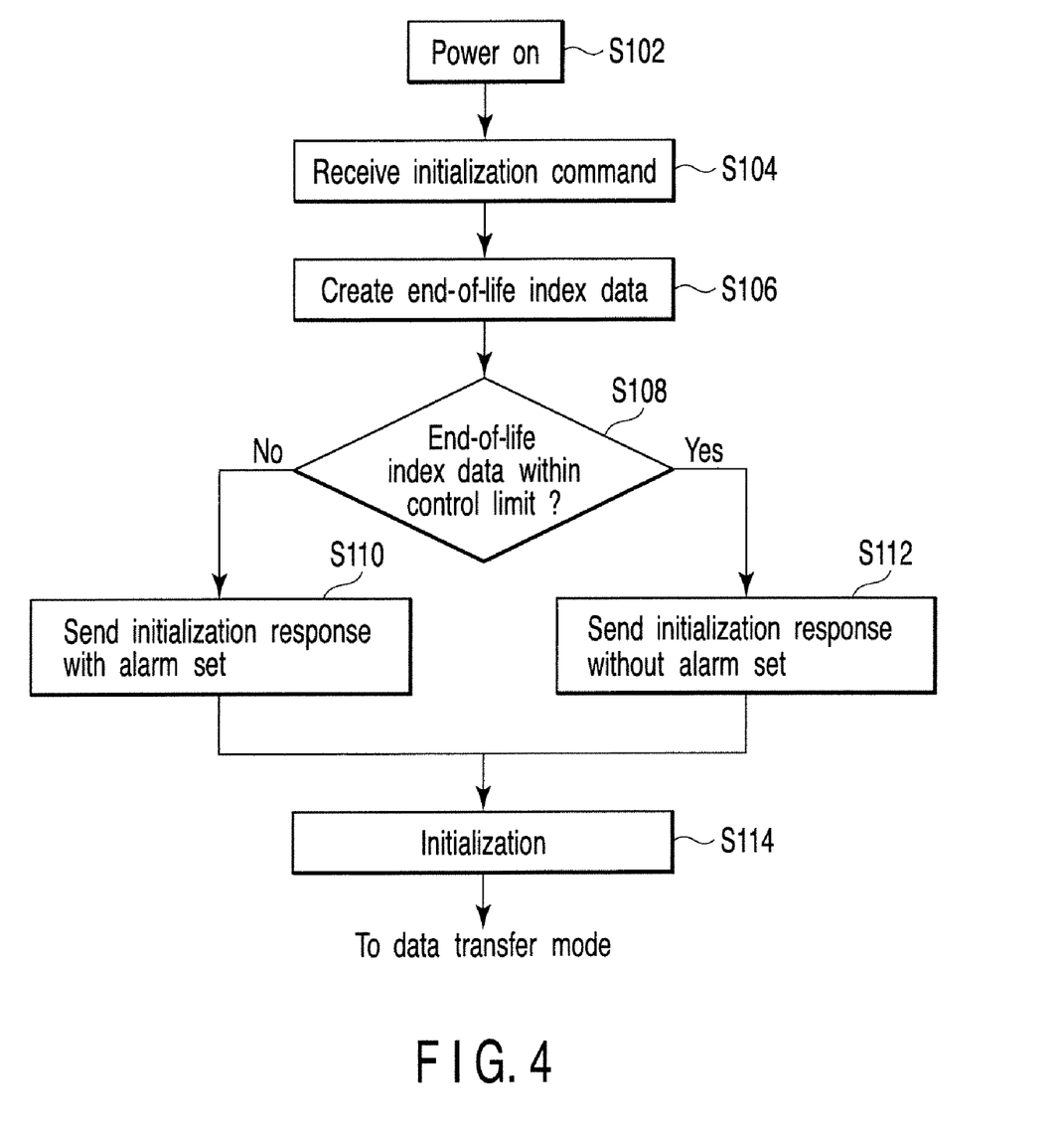
FIG. 4 is a flowchart for explaining an example of a process according to a first embodiment of the present invention.

A method of controlling the semiconductor memory card 10 to communicate a warning to the host device 20 and notify it of the imminent end of the life of the semiconductor memory card 10 according to this embodiment will be described next. FIG. 4 is a flowchart for explaining an example of a process according to this embodiment.

In step S102, the semiconductor memory card 10, e.g., an SD memory card is powered on by powering on the host device 20 incorporating it. Alternatively, the SD memory card 10 is powered on by attaching it to the host device 20.

In step S104, the SD memory card 10 receives an initialization command issued by the host device 20. In step S106, responding to the initialization command, the SD memory card 10 reads information of each block from the system management area of the NAND flash memory 12 and obtains the remaining spare block count R based on counting of defective blocks. The SD memory card 10 stores the remaining spare block count R in the RAM of the card controller 14 as an end-of-life index data.

In step S108, it is determined whether the end-of-life index data satisfies a life control limit for end-of-life determination, i.e., the spare block control limit. If the end-of-life index data does not satisfy the life control limit, i.e., if the remaining spare block count R is less than the spare block control limit value L (R<L), the end-of-life warning status is set to an alarm, and the process advances to step S110.

In step S110, the SD memory card 10 sends an initialization response containing the end-of-life warning status set to an alarm to the host device 20. The initialization response is communicated through the same command communication line that communicates an initialization command, as described above with reference to FIG. 3. The end-of-life warning status can be put into the initialization response by using one of a plurality of reserve bits which are unused in it. To set the end-of-life warning status to an alarm and communicate it, for example, a reserve bit X is set to "1". If no alarm need be sent, the reserve bit X is set to "0".

If the end-of-life index data satisfies the life control limit, i.e., if the remaining spare block count R is equal to or greater than the spare block control limit value L (R≧L) in step S108, the process advances to step S112. In step S112, the SD memory card 10 sends an initialization response containing the end-of-life warning status without setting an alarm to the host device 20.

In step S114, the SD memory card 10 executes the remaining initialization process. When the initialization is completed, the operation proceeds to a data transfer mode.

Upon receiving the end-of-life warning status set to an alarm from the semiconductor memory card 10 in step S110, the host device 20 can warn the user by, e.g., displaying, on its display screen, a warning message that says, "The semiconductor memory card being used is near the end of its life. Please create backup copies of data and replace the memory card with a new one in good time". This enables to warn the user of the host device 20 of the imminent end of the life of the semiconductor memory card 10 before it becomes unusable. Hence, the semiconductor memory card is prevented from becoming unusable and losing data stored therein.

In actual utilization, after the semiconductor memory card 10 is powered on, rewrite may be done a plurality of number of times until it is powered off. In an ordinary use environment, however, rewrite is not executed so many times as to greatly change the life of the semiconductor memory card. Hence, even when the end-of-life index data is sent to the host device 20 only once at the time of initializing the semiconductor memory card, no problems for use arise. It is possible to reduce load on the processing of the semiconductor memory card because the end-of-life index data is created only once in initialization step. Additionally, changes in software of the semiconductor memory card can be reduced.

As described above, this embodiment allows the semiconductor memory card to communicate its end-of-life warning status to the host device by using the initialization response to the initialization command from the host device. This provides a method of controlling the semiconductor memory card to warn the user of the host device of the imminent end of the life of the semiconductor memory card before it becomes unusable.

Second Embodiment

A second embodiment of the present invention provides a method of controlling a semiconductor memory card, in which the semiconductor memory card communicates with a host device of an end-of-life warning status by putting it into a command receipt response responding to one of a data write command, a data read command, and a status read command from the host device to the semiconductor memory card, the host device incorporates the semiconductor memory card therein. This embodiment will be described by exemplifying the data write command (to be simply referred to as a write command hereinafter).

This embodiment enables to warn a user of the host device 20 of the imminent end of the life of the semiconductor memory card 10 before it becomes unusable. The user of the host device 20 can replace the semiconductor memory card 10 on the basis of this warning. This prevents the semiconductor memory card 10 from becoming unusable and losing data stored therein.

This embodiment will be explained by exemplifying a case wherein the erase/write count of each block of a NAND flash memory 12 included in the semiconductor memory card 10, e.g., an SD memory card, is used as the index of the end-of-life warning status of the SD memory card 10.

The erase/write count of each block of the NAND flash memory 12 is stored in its predetermined system management area and updated after data erase/write operation is executed in each block.

Figure 5:
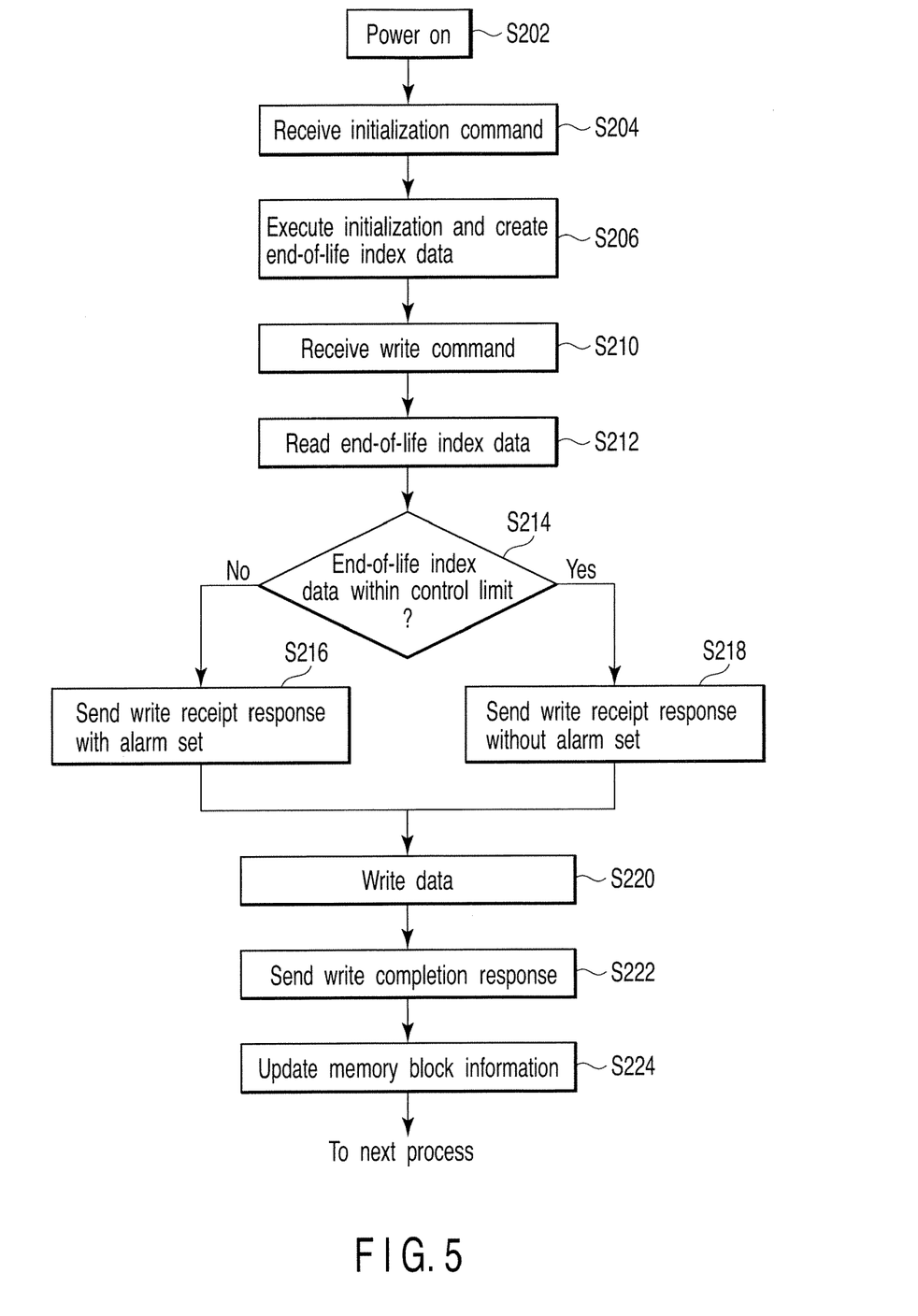
FIG. 5 is a flowchart for explaining an example of a process according to a second embodiment of the present invention.

A method of controlling the semiconductor memory card 10 to warn the host device 20 of the imminent end of the life of the semiconductor memory card 10 according to this embodiment will be described next. FIG. 5 is a flowchart for explaining an example of a process according to this embodiment.

In step S202, the semiconductor memory card 10, e.g., an SD memory card, is powered on. The host device 20 issues an initialization command to the SD memory card 10 (step S204). In step S206, the SD memory card 10 executes initialization in response to the initialization command. In the initialization, the SD memory card 10 reads the erase/write count of each block from the information of each block stored in the system management area of the NAND flash memory 12. The number W of life blocks whose erase/write count is larger than a predetermined reference value is counted and stored in the RAM of a card controller 14 as end-of-life index data. The control limit value of erase/write count is determined on the basis of the characteristics and applications of the SD memory card 10.

In step S210, the SD memory card 10 receives a write command from the host device 20. In step S212, the SD memory card 10 reads the end-of-life index data from the RAM in response to the write command.

In step S214, it is determined whether the end-of-life index data satisfies a life control limit for end-of-life determination, i.e., a life block control limit M. If the end-of-life index data does not satisfy the life control limit, i.e., if the number W of life blocks whose erase/write count is larger than the predetermined reference value is greater than the life block control limit value M (W>M), the end-of-life warning status is set to an alarm, and the process advances to step S216. The life block control limit value M is determined on the basis of the characteristics and applications of the SD memory card 10.

In step S216, the SD memory card 10 sends a write command receipt response containing the end-of-life warning status set to an alarm to the host device 20. The write command receipt response is sent through a command communication line that communicates the write command. The end-of-life warning status can be put into the write command receipt response by using one of a plurality of reserve bits which are unused in it. To set the end-of-life warning status to an alarm and communicate it, for example, a reserve bit X is set to "1". If no alarm need be sent, the reserve bit X is set to "0".

If the end-of-life index data satisfies the life control limit, i.e., if the number W of life blocks whose erase/write count is larger than the predetermined reference value is equal to or less than the life block control limit value M (W≦M), in step S214, the process advances to step S218. In step S218, the SD memory card 10 sends a write command receipt response containing the end-of-life warning status without setting an alarm to the host device 20.

In step S220, data is written in a write target NAND block. If the write target NAND block is defective, data is written in another spare block.

When the write is completed, the SD memory card 10 sends a write completion response to the host device 20 in step S222, and the process is completed. The write completion response is communicated through the same command communication line as that for the write command.

After sending the write completion response, the SD memory card 10 updates the information of each block stored in the system management area of the NAND flash memory 12 in step S224. That is, the SD memory card 10 increments the erase/write count of the write-accessed block by one. If the write target block is defective, it is stored in the system management area as a defective block. This decrements the remaining spare block count.

For data read or status read, a data read command or status read command is received in step S210. In step S220, data or status is read. In step S222, the readout data or status is sent to the host device 20. In this case, memory block information is not updated in step S224.

Upon receiving the end-of-life warning status set to an alarm from the semiconductor memory card 10 in step S216, the host device 20 can warn its user of the imminent end of the life of the semiconductor memory card 10 by various methods. This enables to warn the user of the imminent end of the life of the semiconductor memory card 10 before it becomes unusable. Hence, the semiconductor memory card is prevented from becoming unusable and losing data stored therein.

In this embodiment, after the semiconductor memory card 10 is powered on, write may be done a plurality of number of times until it is powered off. Even in the second or subsequent write, the information that is stored in the RAM of the card controller 14 at the time of initialization of the semiconductor memory card 10 is used as the end-of-life index data. Although each write command receipt response returns the same end-of-life warning status, no problems for use arise. It is possible to reduce load on the process of the semiconductor memory card 10 because the end-of-life index data is created only once in initialization.

In this embodiment, the end-of-life warning status of the semiconductor memory card 10 is sent to the host device 20 by using a write command receipt response. Instead, a write completion response containing the end-of-life warning status may be sent to the host device 20.

As described above, this embodiment provides a method of controlling a semiconductor memory card to warn the user of the imminent end of its life by a write command receipt response or a write completion response from the semiconductor memory card responding to a write command from the host device.

Third Embodiment

In a third embodiment of the present invention, the end-of-life index data of a semiconductor memory card 10 is created every time it receives a write command from a host device 20 incorporating the semiconductor memory card 10. The semiconductor memory card 10 sends, to the host device 20, a write command receipt response or a write completion response responding to the write command and containing the end-of-life warning status. This embodiment will be explained by exemplifying a case wherein the end-of-life index data of the semiconductor memory card 10 is created after write is finished.

This embodiment enables to warn the user of the host device 20 of the imminent end of the life of the semiconductor memory card 10 before it becomes unusable. The user of the host device 20 can replace the semiconductor memory card 10 on the basis of this warning. This prevents the semiconductor memory card 10 from becoming unusable and losing data stored therein.

This embodiment will be explained by exemplifying a case wherein both a remaining spare block count of a NAND flash memory 12 included in the semiconductor memory card 10, e.g., an SD memory card, and the number of life blocks whose erase/write count is larger than a predetermined reference value in the NAND flash memory 12 are used as index data to create the end-of-life warning status of the SD memory card 10.

In practicing this embodiment, the host device 20 is preferably notified in advance in initialization of the semiconductor memory card 10 that it is a card having an end-of-life warning function.

Figure 6:
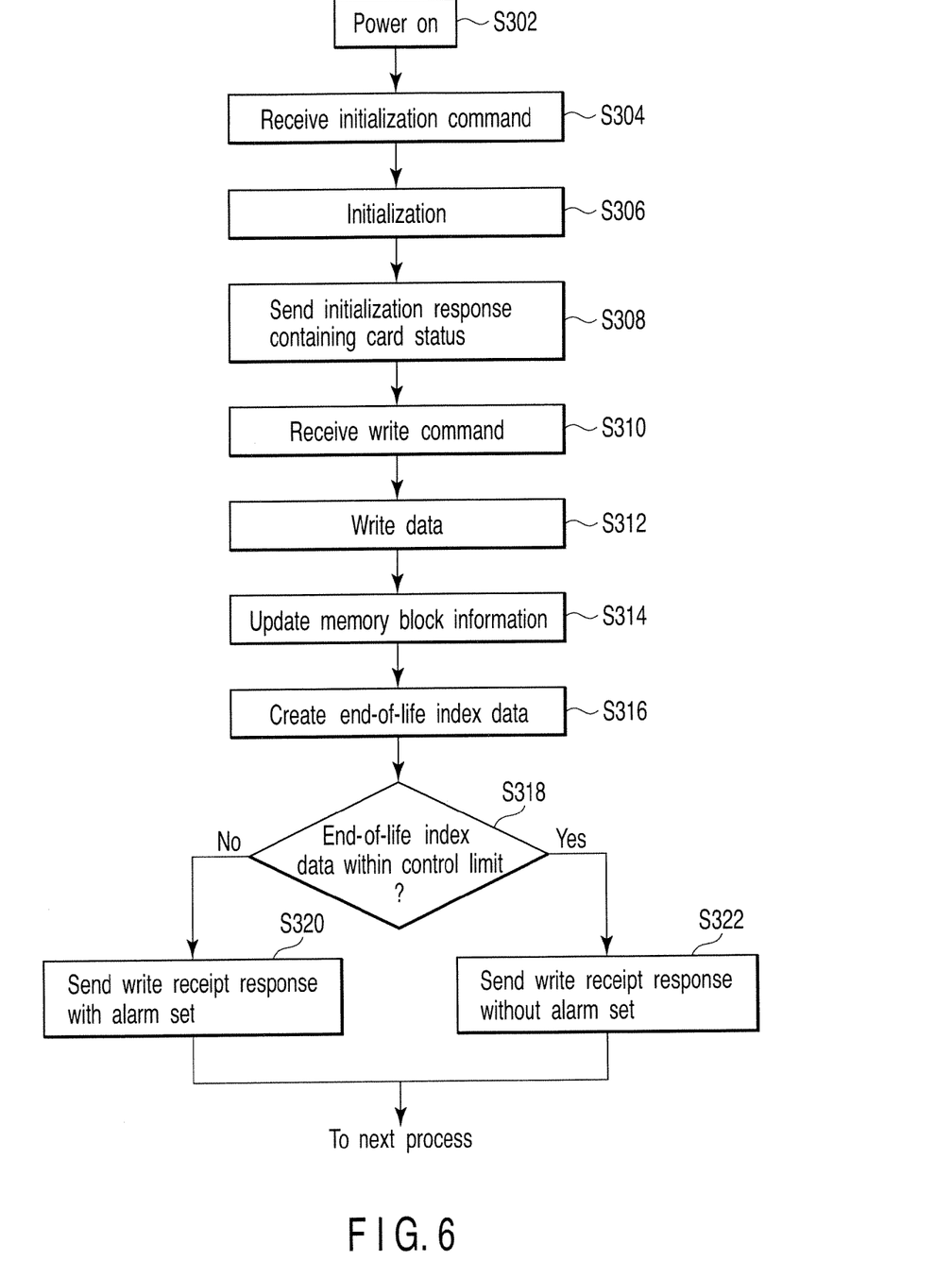
FIG. 6 is a flowchart for explaining an example of a process according to a third embodiment of the present invention.

A method of controlling the semiconductor memory card 10 to warn the host device 20 of the imminent end of the life of the semiconductor memory card 10 according to this embodiment will be described next. FIG. 6 is a flowchart for explaining an example of a process according to this embodiment.

In step S302, the semiconductor memory card 10, e.g., an SD memory card is powered on. The SD memory card 10 receives an initialization command issued by the host device 20 (step S304). In step S306, the SD memory card 10 executes initialization in response to the initialization command.

In step S308, the SD memory card 10 sends, to the host device 20, an initialization response containing a card status representing that the SD memory card 10 being in use has an end-of-life warning function. The initialization response is communicated through the same command communication line as that for the initialization command. The card status can be put into the initialization response by using one of a plurality of reserve bits which are unused in it. The reserve bit used to notify the host device of the card status is preferably different from a reserve bit X used in the first embodiment to notify the host device of the end-of-life warning status. If the SD memory card 10 has an end-of-life warning function, for example, a reserve bit Y is set to "1". The reserve bit Y is normally "0". Hence, if the SD memory card 10 has no end-of-life warning function, the reserve bit Y remains "0". When the initialization is completed, the operation proceeds to a data transfer mode.

In step S310, the SD memory card 10 receives a write command issued by the host device 20. In step S312, the SD memory card 10 writes data in a write target NAND block of the NAND flash memory 12 in response to the write command. In write, for example, if write in the write target NAND block does not complete within a predetermined time period, the NAND block is determined to be defective, and the data is written in another spare block.

When write is completed, the SD memory card 10 updates the information of each block stored in the system management area of the NAND flash memory 12 in step S314. That is, the SD memory card 10 increments the erase/write count of the write-accessed block by one. If the write target block is defective, information representing that the block is defective is written. This decrements the remaining spare block count.

After the information of each block is updated, the SD memory card 10 reads the updated information of each block from the system management area to create an end-of-life index data in step S316. More specifically, the number of defective blocks is counted on the basis of the information in the system management area to obtain a remaining spare block count R as the end-of-life index of the SD memory card 10. In addition, the number W of life blocks whose erase/write count is larger than a predetermined reference value is obtained. In this way, the SD memory card 10 creates end-of-life index data on which the latest block information is reflected.

In step S318, it is determined whether the end-of-life index data, i.e., each of the remaining spare block count R and the number W of life blocks whose erase/write count is larger than the predetermined reference value, satisfy respective life control limit for end-of-life determination, that is a spare block control limit value L or a life block control limit value M. If at least one of the end-of-life index data R or W does not satisfy the life control limit value L or M, i.e., if R<L or W>M, the end-of-life warning status is set to an alarm. When an alarm is set, the process advances to step S320. If no alarm is set, i.e., if R≧L and W≦M, the process advances to step S322.

The life control limit value for end-of-life determination, such as the spare block control limit value L and the life block control limit value M, are determined on the basis of the characteristics and applications of the semiconductor memory card 10.

In step S320, the SD memory card 10 sends a write completion response containing the end-of-life warning status set to an alarm to the host device 20. The write completion response is communicated through a command communication line that communicates the write command. The end-of-life warning status can be put into the write completion response by using one of a plurality of reserve bits which are unused in it.

If no alarm is set in step S318, a write completion response containing the end-of-life warning status without setting an alarm is sent to the host device 20 in step S322.

The end-of-life warning status can be put into the write completion response by using one of a plurality of reserve bits. For example, to set the end-of-life warning status to an alarm and send it, the reserve bit X is set to "1". If no alarm is set, the reserve bit X is set to "0".

When the end-of-life warning status is sent to the host device 20, the process is completed, and the operation proceeds to the next process.

Upon receiving the end-of-life warning status set to an alarm from the semiconductor memory card 10 in step S320, the host device 20 can warn the user of the imminent end of the life of the semiconductor memory card 10 by various methods. This enables to warn the user of the host device 20 of the imminent end of the life of the semiconductor memory card 10 before it becomes unusable. Hence, the semiconductor memory card is prevented from becoming unusable and losing data stored therein.

According to this embodiment, it is possible to create the end-of-life warning status on the basis of the latest end-of-life index data of the semiconductor memory card 10.

As described above, this embodiment provides a method of controlling a semiconductor memory card to warn the user of a host device of the imminent end of the life of the semiconductor memory card before it becomes unusable by using a write completion response from the semiconductor memory card responding to a write command from the host device.

Fourth Embodiment

A fourth embodiment of the present invention provides a method of controlling a semiconductor memory card 10, in which a host device 20 incorporating the semiconductor memory card 10 or a user of the host device 20 uses a dedicated life information request command to know the life information of the semiconductor memory card 10 as needed, and the semiconductor memory card 10 puts its end-of-life warning status into a life information response to that command and sends the response.

Figure 7:
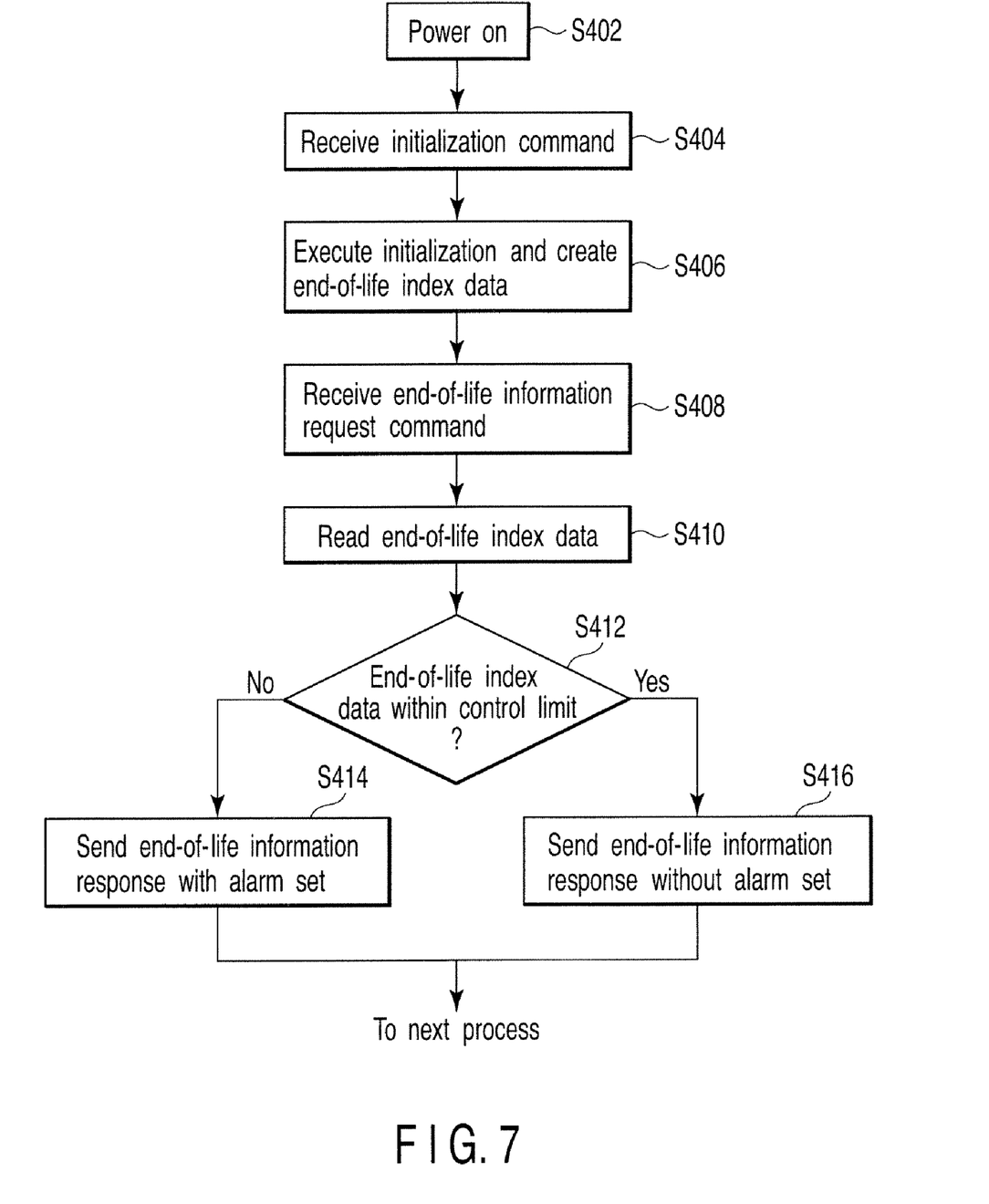
FIG. 7 is a flowchart for explaining an example of a process according to a fourth embodiment of the present invention.

An example of this embodiment will be described with reference to the flowchart in FIG. 7. In this example, end-of-life index data is created on the basis of the information of each block read from a system management area and stored in the RAM in a card controller 14 during initialization in step S406, as in the first and second embodiment. The end-of-life index data can use a remaining spare block count R of a NAND flash memory 12, as in the first embodiment, the number W of life blocks whose erase/write count is larger than a predetermined reference value, as in the second embodiment, or a combination thereof, as in the third embodiment.

Upon receiving a life information request command from the host device 20 in step S408, the semiconductor memory card 10 reads the end-of-life index data from the RAM of the card controller 14 (step S410). In step S412, determination is done by comparing the end-of-life index data with the life control limit value to create an end-of-life warning status. If the end-of-life index data does not satisfy the life control limit value, it is determined that the semiconductor memory card 10 is near the end of its life. In step S414, the semiconductor memory card 10 sends a life information response containing the end-of-life warning status to the host device 20. The life information response is communicated through the same command communication line as that for the life information request command. If the end-of-life index data satisfies the life control limit, the semiconductor memory card 10 sends a life information response containing the end-of-life warning status without setting an alarm to the host device 20 in step S416.

In this embodiment, the end-of-life index data is created during initialization. However, the end-of-life index data can be created at any other appropriate timings. For example, it is possible to create end-of-life index data after write is completed, as in the third embodiment. Alternatively, the end-of-life index data may be created on the basis of the latest block information in response to a life information request command.

As described above, this embodiment provides a method of controlling a semiconductor memory card to warn the user of a host device of the imminent end of the life of the semiconductor memory card before it becomes unusable by using a life information response responding to a life information request command from the host device.

Fifth Embodiment

A fifth embodiment of the present invention provides a method of controlling a semiconductor memory card host device 20 incorporating a semiconductor memory card 10, which receives end-of-life warning information from the semiconductor memory card 10 and notifies the user of the host device 20 of the imminent end of the life of the semiconductor memory card 10.

Figure 8:
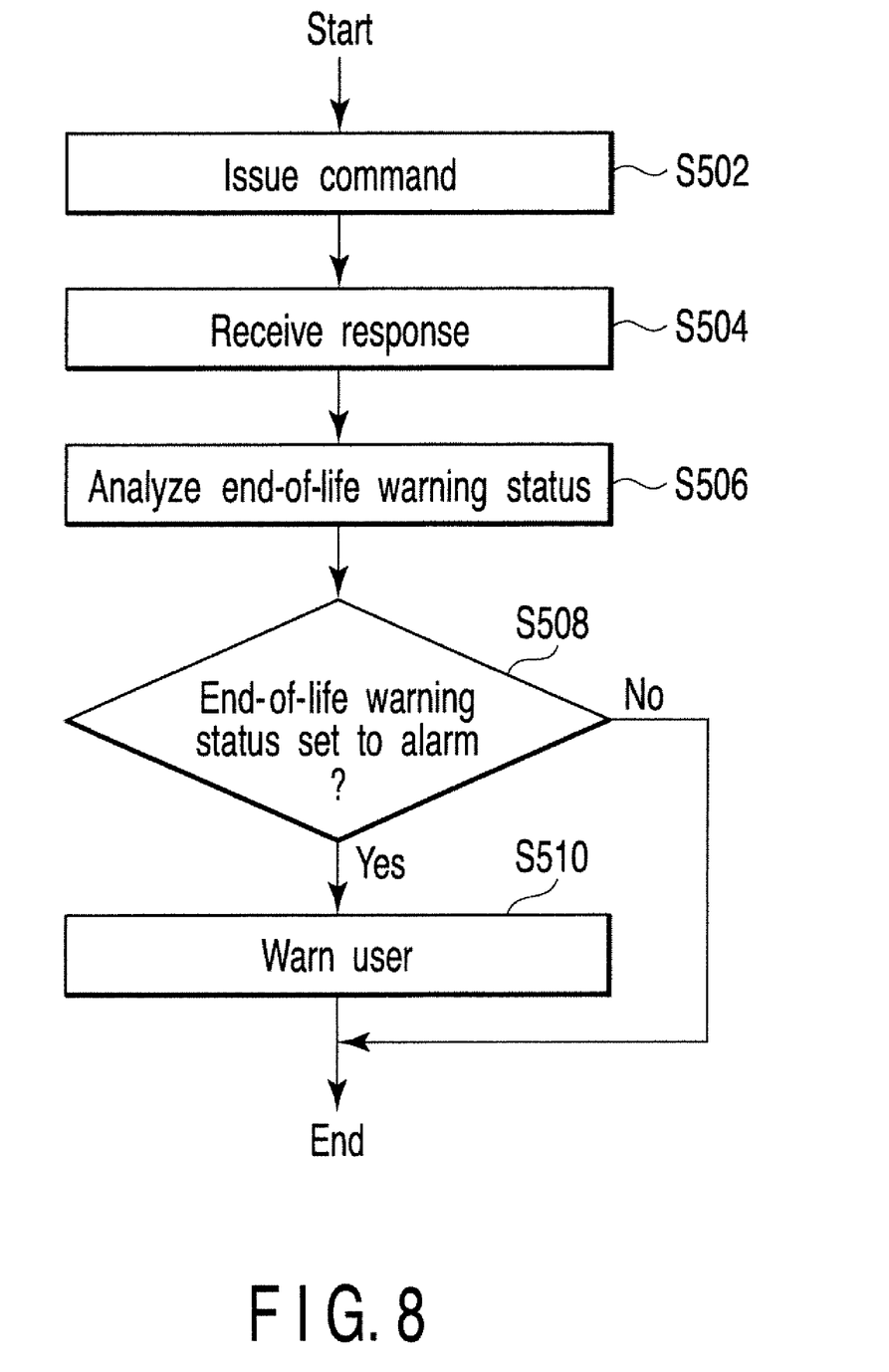
FIG. 8 is a flowchart for explaining an example of a process according to a fifth embodiment of the present invention.

An example of the method of controlling the host device 20 incorporating the semiconductor memory card 10 according to this embodiment will be described with reference to the flowchart in FIG. 8.

In step S502, the host device 20 issues a predetermined command to request memory card life information of the semiconductor memory card 10, e.g., an SD memory card. This command can be any one of an initialization command, data write command, data read command, and dedicated command to request life information, or a combination thereof. In response to this command, the semiconductor memory card 10 create an end-of-life warning status on the basis of its end-of-life index data and life control limit value and sends a response containing the end-of-life warning status to the host device 20. The end-of-life index data of the semiconductor memory card 10 can be, e.g., a remaining spare block count R of a NAND flash memory 12, the number of life blocks whose erase/write count is larger than a predetermined reference value, or a combination thereof, as described in the first to fourth embodiments.

In step S504, the host device 20 receives the response to the command from the semiconductor memory card 10. The response contains the end-of-life warning status. The response is sent through the same command communication line as that for the command.

In step S506, the host device 20 analyzes the received end-of-life warning status, and determines whether an alarm is set in step S508. If the alarm is set, the host device 20 can warn its user of the imminent end of the life of the semiconductor memory card 10 in step S510. Warning can be done by various methods. For example, the host device 20 can display, on its display screen, a warning message that says, "The card being used is near the end of its life. Please create backup copies of data and replace the card with a new one in good time". After the user of the host device 20 is warned, the next process starts. This enables to warn the user of the host device 20 of the imminent end of the life of the semiconductor memory card 10 before it becomes unusable.

If no alarm is set in the end-of-life warning status, in step S506, the process is completed, and the next process starts.

As described above, according to this embodiment, the host device can know the imminent end of the life of the semiconductor memory card by a response from the memory card responding to a command to request the life information of the semiconductor memory card. Based on the life information, there is provided a method of controlling a semiconductor memory card host device that warns the user of the host device before the semiconductor memory card becomes unusable.

The above-described embodiments are merely examples, and the present invention allows various changes and modifications. In the above-described embodiments, the end-of-life warning status is communicated by a response to one command that requests the life information of the semiconductor memory card. However, a combination of a plurality of commands is also usable. For example, the end-of-life warning status of the semiconductor memory card may be put into each of responses to an initialization command and a write command so as to communicate the end-of-life warning status at a plurality of timings.

The end-of-life index data can also use one of the remaining spare block counts of the NAND flash memory and the number of life blocks whose erase/write count is larger than a predetermined reference value, or a combination thereof in each embodiment.

Warning to the user of the host device can be done by displaying a warning message on the display screen of the host device, outputting a voice warning message, outputting an alarm sound, or turning on an alarm lamp, or by combining some of these methods.

In the above-described embodiments, an SD memory card has been exemplified as a semiconductor memory card. The present invention is also applicable to any other memory card using a flash memory with a similar interface and a semiconductor memory device of any other type.

As described above, the present invention provides a method of controlling a semiconductor memory card system which puts information to notify a user of the imminent end of the life of a semiconductor memory card in a response from the memory card responding to a command from a host device incorporating the semiconductor memory card. This enables to warn the user of the host device of the imminent end of the life of the semiconductor memory card before it becomes unusable. Hence, the semiconductor memory card is prevented from becoming unusable and losing data stored therein.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of controlling a semiconductor memory card, the method comprising:
    creating end-of-life index data of the semiconductor memory card;
    reading the end-of-life index data in response to a command from a host device to the semiconductor memory card;
    creating an end-of-life warning status of the semiconductor memory card from the end-of-life index data on the basis of a life control limit value;
    determining whether to send a response with an alarm or to send a response without the alarm from the semiconductor memory card to the host device according to the end-of-life warning status; and
    sending the response containing the end-of-life warning status by using at least one of a plurality of reserve bits which are unused in the response to the command to the host device through a same communication line as that for the command, prior to executing the command.

2. The method according to claim 1, wherein the command is an initialization command.

3. The method according to claim 1, wherein the command is a data write command.

4. The method according to claim 1, wherein the command is a life information request command.

5. The method according to claim 1, wherein the end-of-life warning status is put into one of reserve bits in the response.

6. The method according to claim 1, wherein the end-of-life index data is a remaining spare block count of the semiconductor memory card.

7. The method according to claim 6, wherein the end-of-life warning status is set to the alarm when the remaining spare block count is less than a first life control limit value.

8. The method according to claim 1, wherein the end-of-life index data is the number of life blocks of the semiconductor memory card, whose erase/write count is larger than a predetermined value.

9. The method according to claim 8, wherein the end-of-life warning status is set to the alarm when the number of life blocks is greater than a second life control limit value.

10. The method according to claim 1, wherein the end-of-life index data is a combination of a remaining spare block count of the semiconductor memory card and the number of life blocks of the semiconductor memory card, whose erase/write count is larger than a predetermined value.

11. The method according to claim 10, wherein the end-of-life warning status is set to the alarm when the remaining spare block count is less than a first life control limit value or when the number of life blocks is greater than a second life control limit value.

12. The method according to claim 1, wherein the end-of-life index data is created in initialization of the semiconductor memory card.

13. The method according to claim 12, wherein the end-of-life index data is updated every time data is written in the semiconductor memory card.

14. The method according to claim 1, wherein the end-of-life warning status is put into a plurality of responses responding to each of a plurality of commands and sent to the host device a plurality of number of times.

15. A method of controlling a host device incorporating a semiconductor memory card, the method comprising:
   causing the host device to issue a command to the semiconductor memory card;
   causing the host device to receive from the semiconductor memory card, a response responding to the issued command and containing an end-of-life warning status of the semiconductor memory card by using at least one of a plurality of reserve bits which are unused in the response to the issued command;
   causing the host device to analyze the end-of-life warning status; and
   causing the host device to warn a user of the host device of imminent end of life of the semiconductor memory card if the end-of-life warning status is set to an alarm, prior to executing the command.

16. The method according to claim 15, wherein the command is one of an initialization command, a data write command, and a life information request command.

17. The method according to claim 15, wherein the warning the user includes displaying a warning message on a display screen.

18. The method according to claim 15, wherein the warning the user includes outputting an alarm sound.

19. The method according to claim 15, wherein the warning the user includes turning on an alarm lamp.

20. The method according to claim 15, wherein the warning the user includes a combination of at least two of displaying a warning message on a display screen, outputting an alarm sound, and turning on an alarm lamp.

* * * * *